US008952258B2

(12) United States Patent
Plucinski et al.

(10) Patent No.: US 8,952,258 B2
(45) Date of Patent: Feb. 10, 2015

(54) IMPLEMENTING GRAPHENE INTERCONNECT FOR HIGH CONDUCTIVITY APPLICATIONS

(71) Applicant: International Business Machines Corporation, Armonk, NY (US)

(72) Inventors: Mark D. Plucinski, Rochester, MN (US); Arvind K. Sinha, Rochester, MN (US); Thomas S. Thompson, Lake City, MN (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 13/624,158

(22) Filed: Sep. 21, 2012

(65) Prior Publication Data

US 2014/0083741 A1 Mar. 27, 2014

(51) Int. Cl.
*H05K 1/09* (2006.01)

(52) U.S. Cl.
USPC ........... 174/250; 174/261; 174/262; 174/267; 257/758; 257/760; 438/622; 438/629; 977/734; 439/66; 439/74

(58) Field of Classification Search
USPC ............. 174/35 R, 35 GC, 36, 250, 261, 262, 174/267; 257/758, 760; 438/622, 629; 977/734
See application file for complete search history.

(56) References Cited

U.S. PATENT DOCUMENTS

| | | | | |
|---|---|---|---|---|
| 4,793,814 | A * | 12/1988 | Zifcak et al. | 439/66 |
| 5,045,635 | A * | 9/1991 | Kaplo et al. | 174/354 |
| 5,120,903 | A * | 6/1992 | Tam | 174/354 |
| 5,142,101 | A * | 8/1992 | Matsuzaki et al. | 174/354 |
| 5,427,535 | A * | 6/1995 | Sinclair | 439/66 |
| 5,578,790 | A * | 11/1996 | Peregrim | 174/356 |
| 6,205,943 | B1 * | 3/2001 | Lonno et al. | 114/117 |
| 6,462,267 | B1 * | 10/2002 | Spies et al. | 174/358 |
| 6,534,706 | B1 * | 3/2003 | Rapp et al. | 174/354 |
| 6,541,698 | B2 * | 4/2003 | Miska | 174/358 |
| 6,670,545 | B2 * | 12/2003 | Botrie | 174/388 |
| 6,832,917 | B1 * | 12/2004 | Neidich | 439/66 |
| 8,057,863 | B2 | 11/2011 | Liang | |
| 8,080,871 | B2 | 12/2011 | Dangelo et al. | |
| 8,169,085 | B2 | 5/2012 | Akimoto et al. | |
| 8,475,180 | B2 * | 7/2013 | Yumi | 439/66 |
| 2005/0087222 | A1 * | 4/2005 | Muller-Werth | 136/224 |
| 2009/0011204 | A1 * | 1/2009 | Wang et al. | 428/215 |
| 2009/0140801 | A1 * | 6/2009 | Ozyilmaz et al. | 327/581 |
| 2010/0200839 | A1 * | 8/2010 | Okai et al. | 257/29 |
| 2010/0224998 | A1 | 9/2010 | Duvall et al. | |
| 2012/0058350 | A1 * | 3/2012 | Long et al. | 428/446 |
| 2012/0068160 | A1 | 3/2012 | Yamazaki et al. | |
| 2012/0080661 | A1 | 4/2012 | Saito et al. | |
| 2012/0080662 | A1 | 4/2012 | Saito et al. | |
| 2012/0080796 | A1 | 4/2012 | Wada et al. | |

OTHER PUBLICATIONS

"Characteristics of Aligned Carbon Nanofibers for Interconnect Via Applications", by Quoc Ngo et al., IEEE Electron Device Letters, vol. 27, No. 4, pp. 221-224, Apr. 2006.

"Graphene Shows High Current Capacity & Thermal Conductivity in Nanoribbons as Narrow as 16 Nanometers", pp. 1-3, Jul. 2009 http://gtresearchnews.gatech.edu/newsrelease/graphene-current.htm.

* cited by examiner

*Primary Examiner* — William H Mayo, III
(74) *Attorney, Agent, or Firm* — Joan Pennington

(57) ABSTRACT

A method, and structures for implementing enhanced interconnects for high conductivity applications. An interconnect structure includes an electrically conductive interconnect member having a predefined shape with spaced apart end portions extending between a first plane and a second plane. A winded graphene ribbon is carried around the electrically conductive interconnect member, providing increased electrical current carrying capability and increased thermal conductivity.

19 Claims, 2 Drawing Sheets

IMPLEMENTING GRAPHENE INTERCONNECT FOR HIGH CONDUCTIVITY APPLICATIONS

FIELD OF THE INVENTION

The present invention relates generally to the electrical connector interconnect field, and more particularly, to a method, and structures for implementing graphene interconnects for high conductivity applications.

DESCRIPTION OF THE RELATED ART

As power requirements continue to rise for high performance computer CPU, I/O, and memory sub-systems, the current carrying capability limitations of connector contacts or interconnects can create significant design challenges for upcoming server systems, and for other complex systems.

One of the main drawbacks of connector contacts or interconnects is limited current carrying capability. This current carrying limitation typically requires distribution of total current for a package over a larger area. Currently the distribution of total current for a package over a larger area can result in a localized warp and typically requires tighter process parameter controls.

A need exists for efficient and effective structures for implementing enhanced interconnects for high conductivity applications. It is desirable to provide such structures that have enhanced electrical current carrying capability together with increased thermal conductivity.

SUMMARY OF THE INVENTION

Principal aspects of the present invention are to provide a method, and structures for implementing enhanced interconnects for high conductivity applications. Other important aspects of the present invention are to provide such method and structures substantially without negative effects and to overcome many of the disadvantages of prior art arrangements.

In brief, a method, and structures for implementing enhanced interconnects for high conductivity applications. An interconnect structure includes an electrically conductive interconnect member having a predefined shape with spaced apart end portions extending between a first plane and a second plane. A winded graphene ribbon is carried around the interconnect member, providing increased electrical current carrying capability and increased thermal conductivity.

In accordance with features of the invention, the predefined shape of the electrically conductive interconnect member includes a generally S-shape extending between the first plane and the second plane.

In accordance with features of the invention, the predefined shape of the electrically conductive interconnect member includes a controlled geometry of a cross-section of the electrically conductive interconnect member for receiving the graphene nano-ribbons in predefined areas.

In accordance with features of the invention, the electrically conductive interconnect member is formed of beryllium copper.

In accordance with features of the invention, the winded graphene ribbon comprises graphene nano-ribbons.

In accordance with features of the invention, providing the winded graphene ribbon enables substantially increased electrical current carrying capability, for example increased by 10 times, without substantially increasing Joule heating.

In accordance with features of the invention, the winded graphene ribbon is wrapped around the predefined shape of the electrically conductive interconnect member including the spaced apart end portions.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing enhanced graphene interconnect structures for high conductivity applications.

Figure 1:
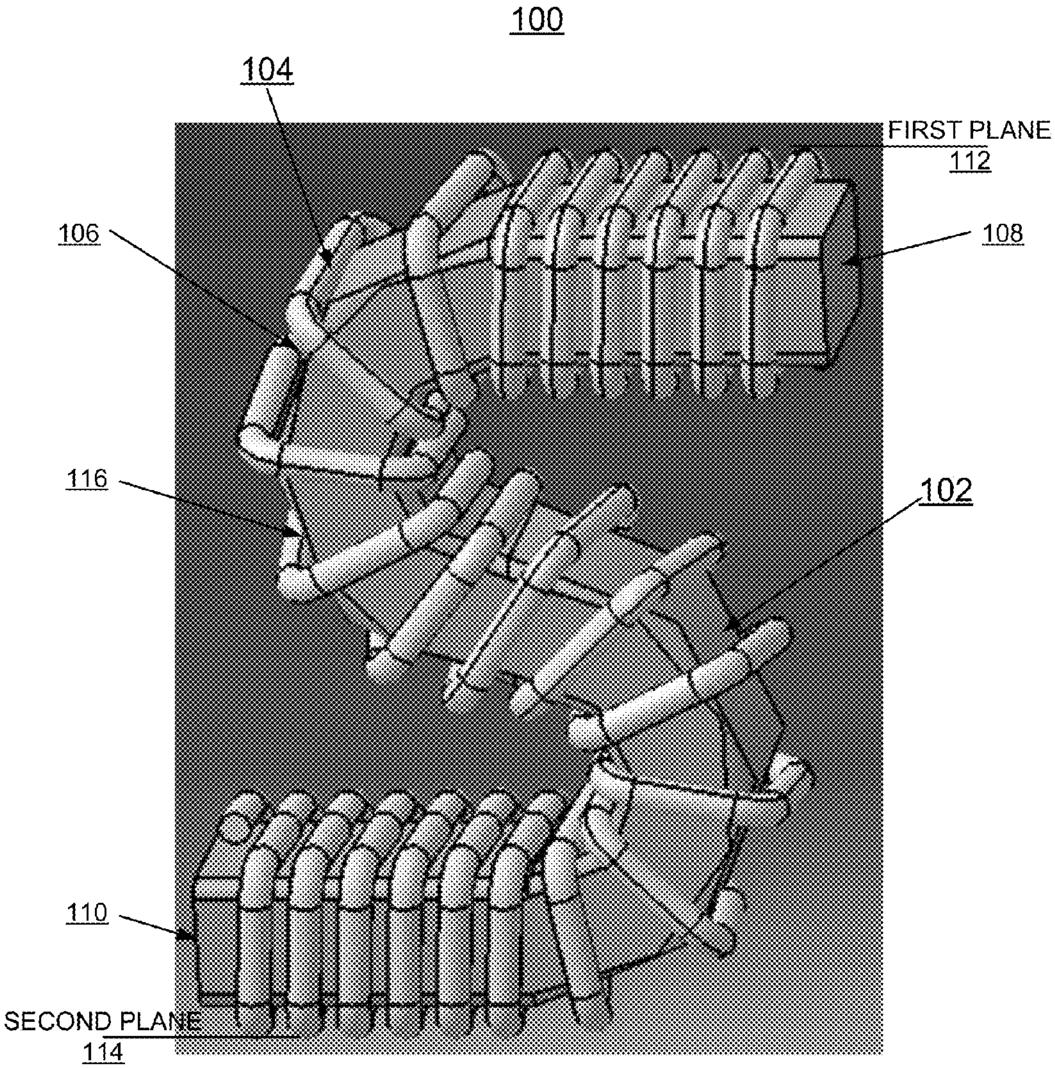
FIG. 1 is a perspective view not to scale of an example graphene interconnect structure in accordance with a preferred embodiment.

Having reference now to the drawings, in FIG. 1 there is shown not to scale an example graphene interconnect structure generally designated by the reference character 100 for implementing enhanced interconnect structures for high conductivity applications in accordance with a preferred embodiment.

Referring to FIG. 1, the graphene interconnect structure 100 includes an electrically conductive interconnect member generally designated by the reference character 102 and a winded graphene ribbon generally designated by the reference character 104 carried around the interconnect member 102. The electrically conductive interconnect member 102 has a predefined shape 106 with spaced apart end portions 108, 110 extending between a first plane 112 and a second plane 114.

In accordance with features of the invention, the predefined shape 106 of the electrically conductive interconnect member 102 includes a generally S-shape extending between the first plane 112 and the second plane 114.

It should be understood that the present invention is not limited to the illustrated graphene interconnect structure 100, for example, various shapes 106 can be used for the graphene interconnect structure 100 in accordance with the invention.

In accordance with features of the invention, the winded graphene ribbon 104 provides substantially increased electrical current carrying capability and increased thermal conductivity. The winded graphene ribbon 104 comprises graphene nano-ribbons. The winded graphene ribbon 104 is wrapped around the predefined shape 106 of the electrically conductive interconnect member 102.

The electrically conductive interconnect member 102 optionally is formed of beryllium copper. It should be understood that the electrically conductive interconnect member 102 can be made of numerous metals including, for example, iron nickel (Fe/Ni) or various copper (Cu) based alloys.

TABLE A

Electrical simulation of graphene interconnect structure 100

| Contact Type | Current Applied | Joule Heating (W/mm^2) |
|---|---|---|
| Conventional interconnect without Graphene | 100 mA | 121.47 |
| Graphene Interconnect | 100 mA | 35.23 |
| Graphene Interconnect | 1000 mA | 128.21 |

In accordance with features of the invention, providing the winded graphene ribbon 104 with the electrically conductive interconnect member 102 enables substantially increased electrical current carrying capability, for example increased by 10 times, without substantially increasing Joule heating. Winding the graphene ribbon 104 is provided around the entire shape 106 of the electrically conductive interconnect member 102 including the spaced apart end portions 108, 110 and a middle portion 116 of the electrically conductive interconnect member.

For example, due to the high thermal conductivity and low resistivity of graphene interconnect 100, a three times decrease in joule heating can result as compared to a convention interconnect without the winded graphene ribbon 104. In Table A, the simulation with 1000 mA applied current for graphene interconnect 100 shows that the joule heating is similar to convention interconnect without the winded graphene ribbon with 100 mA applied current. The current capability of graphene interconnect 100 being increased by ten times (10×) with about the same joule heating.

In accordance with features of the invention, this technique of constructing graphene nano-ribbons 104 with standard contacts has potential to increase the current carrying capacity of various contacts used for power and other LGA application.

Figure 2:
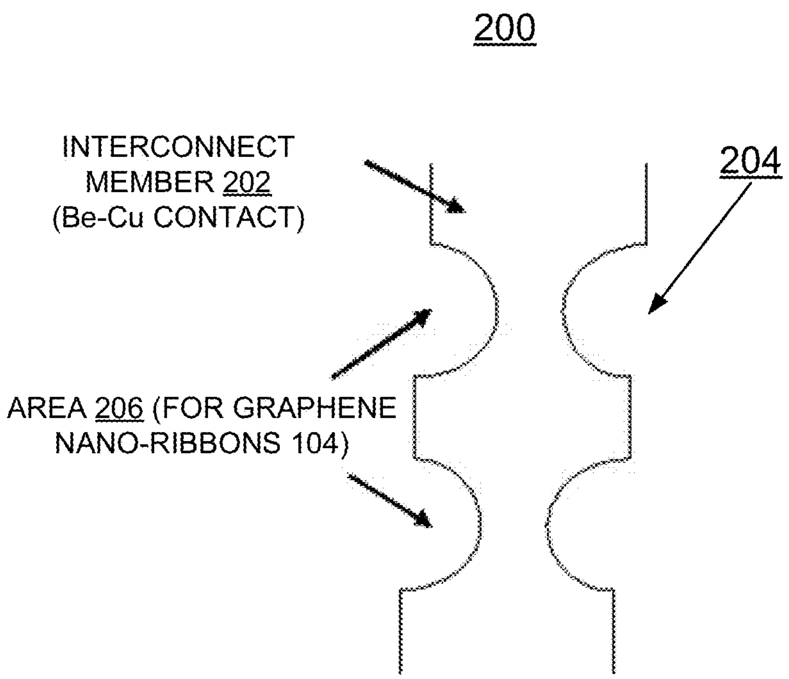
FIG. 2 is a cross-sectional side view not to scale of an example graphene interconnect structure in accordance with a preferred embodiment.

In accordance with features of the invention, the predefined shape of the electrically conductive interconnect member optionally includes a controlled geometry of a cross-section of the electrically conductive interconnect member for receiving graphene nano-ribbons in predefined areas as illustrated and described with respect to FIG. 2.

Referring to FIG. 2, there is shown another example graphene interconnect structure generally designated by the reference character 200 for implementing enhanced interconnect structures for high conductivity applications in accordance with a preferred embodiment.

The graphene interconnect structure 200 includes an electrically conductive interconnect member 202 having a controlled cross-section geometry generally designated by the reference character 204 providing a predefined area 206 for receiving the winded graphene ribbon or graphene nanoribbons 104.

While the present invention has been described with reference to the details of the embodiments of the invention shown in the drawing, these details are not intended to limit the scope of the invention as claimed in the appended claims.

What is claimed is:

1. A structure for implementing enhanced interconnects for high conductivity applications comprising:

an interconnect structure comprising an electrically conductive interconnect member having a predefined shape with spaced apart end portions extending between a first plane and a second plane; and a winded graphene ribbon being carried around said electrically conductive interconnect member, said winded graphene ribbon providing increased electrical current carrying capability and increased thermal conductivity.

2. The structure as recited in claim 1 wherein said predefined shape of said electrically conductive interconnect member includes a generally S-shape.

3. The structure as recited in claim 1 wherein said predefined shape of said electrically conductive interconnect member includes a controlled cross-section geometry defining a predefined area for receiving said winded graphene ribbon.

4. The structure as recited in claim 1 wherein said electrically conductive interconnect member is formed of beryllium copper.

5. The structure as recited in claim 1 wherein said winded graphene ribbon comprises graphene nano-ribbons.

6. The structure as recited in claim 1 wherein said winded graphene ribbon extends around the predefined shape of the electrically conductive interconnect member including the spaced apart end portions.

7. The structure as recited in claim 1 wherein said winded graphene ribbon enables substantially increased electrical current carrying capability without substantially increasing Joule heating.

8. The structure as recited in claim 7 includes electrical current carrying capability increased by about 10 times without substantially increasing Joule heating.

9. The structure as recited in claim 1 wherein said winded graphene ribbon is provided in predefined areas of said electrically conductive interconnect member.

10. The structure as recited in claim 1 wherein said predefined areas of said electrically conductive interconnect member include predefined areas of said electrically conductive interconnect member having reduced cross-section.

11. A method for implementing enhanced interconnects for high conductivity applications comprising:

providing an interconnect structure comprising providing an electrically conductive interconnect member having a predefined shape with spaced apart end portions extending between a first plane and a second plane; and winding a graphene ribbon around said electrically conductive interconnect member, said winded graphene ribbon providing increased electrical current carrying capability and increased thermal conductivity.

12. The method as recited in claim 11 includes providing a generally S-shape for said predefined shape of said electrically conductive interconnect member.

13. The method as recited in claim 11 includes providing said predefined shape of said electrically conductive interconnect member with a controlled cross-section geometry defining a predefined area for receiving said winded graphene ribbon.

14. The method as recited in claim 11 includes forming said electrically conductive interconnect member of beryllium copper.

15. The method as recited in claim 14 includes forming said winded graphene ribbon of graphene nano-ribbons.

16. The method as recited in claim 11 wherein winding said graphene ribbon around said electrically conductive interconnect member includes winding said graphene ribbon spaced apart around the entire predefined shape of the electrically conductive interconnect member including the spaced apart end portions.

17. The method as recited in claim 11 includes providing predefined areas of said electrically conductive interconnect member for receiving said winded graphene ribbon.

18. The method as recited in claim 17 includes providing said predefined shape of said electrically conductive interconnect member with a controlled cross-section geometry defining each said predefined area for receiving said winded graphene ribbon.

19. The method as recited in claim 11 wherein said winded graphene ribbon enables substantially increased electrical current carrying capability without substantially increasing Joule heating.

* * * * *